United States Patent
Beck et al.

(10) Patent No.: US 10,788,540 B2
(45) Date of Patent: Sep. 29, 2020

(54) FAULT DETECTION CIRCUIT AND RELATED METHODS

(71) Applicant: SEMICONDUCTOR COMPONENTS INDUSTRIES, LLC, Phoenix, AZ (US)

(72) Inventors: Riley Beck, Eagle Mountain, UT (US); Rishi Pratap Singh, Provo, UT (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 495 days.

(21) Appl. No.: 15/796,336

(22) Filed: Oct. 27, 2017

(65) Prior Publication Data
US 2019/0128941 A1    May 2, 2019

(51) Int. Cl.
| | | |
|---|---|---|
| *G01R 31/50* | (2020.01) | |
| *G01R 31/34* | (2020.01) | |
| *H02H 1/00* | (2006.01) | |
| *H02H 3/16* | (2006.01) | |
| *H02H 7/08* | (2006.01) | |

(52) U.S. Cl.
CPC ............. *G01R 31/50* (2020.01); *G01R 31/34* (2013.01); *H02H 1/0007* (2013.01); *H02H 3/16* (2013.01); *H02H 7/08* (2013.01)

(58) Field of Classification Search
CPC ...... G01R 31/025; G01R 31/34; G01R 31/50; G01R 31/52; H02H 1/0007; H02H 1/04; H02H 3/05; H02H 3/16; H02H 3/33; H02H 7/08

USPC .......................................................... 361/42
See application file for complete search history.

(56) References Cited

U.S. PATENT DOCUMENTS

| | | | |
|---|---|---|---|
| 2014/0092503 A1* | 4/2014 | Ostrovsky | .............. H02H 3/044 361/45 |
| 2014/0098446 A1 | 4/2014 | Aromin | |
| 2014/0268436 A1 | 9/2014 | Du | |

* cited by examiner

*Primary Examiner* — Kevin J Comber
(74) *Attorney, Agent, or Firm* — Adam R. Stephenson, LTD.

(57) ABSTRACT

Implementations of fault detection circuits may include a first current transformer coupled to a second current transformer, a positive feedback circuit including the first current transformer, the second current transformer, a first switch, and one of a comparator, an amplifier, and an inverter. The circuit may also include a plurality of logic gates that may be coupled with the positive feedback circuit. The positive feedback circuit may be configured to oscillate upon detecting a ground neutral fault and to send a fault signal to the plurality of logic gates. The plurality of logic gates may be configured to analyze the fault signal and open the first switch. The plurality of logic gates may be further configured to identify whether the fault signal represents one of a true fault or a noise fault by analyzing the output of the positive feedback circuit after the first switch has been opened.

20 Claims, 10 Drawing Sheets

FAULT DETECTION CIRCUIT AND RELATED METHODS

BACKGROUND

1. Technical Field

Aspects of this document relate generally to circuits and methods for detecting current faults. More specific implementations involve fault detection circuits such as a circuit used to detect a normal ground fault or grounded neutral fault coupled to a ground fault interrupter (GFI) circuit.

2. Background

Conventionally, electrical appliances are powered by receiving alternating current (AC) power from a power supply through a pair of conducting lines. Various current faults might occur which can lead to a risk of electric shock, damage to a load, or to the lines.

SUMMARY

Implementations of fault detection circuits may include a first current transformer coupled to a second current transformer, a positive feedback circuit including the first current transformer, the second current transformer, a first switch, and one of a comparator, an amplifier, and an inverter, and any combination thereof, all operatively coupled together. The fault detection circuit may also include a plurality of logic gates that may be coupled with the positive feedback circuit. The positive feedback circuit may be configured to oscillate upon detecting a ground neutral fault and to send a fault signal to the plurality of logic gates. The plurality of logic gates may be configured to analyze the fault signal and open the first switch. The plurality of logic gates may be further configured to identify whether the fault signal represents one of a true fault or a noise fault by analyzing the output of the positive feedback circuit after the first switch has been opened.

Implementations of fault detection circuits may include one, all, or any of the following:

The positive feedback circuit may include a second switch, and a third switch, wherein the second switch is configured to open with the first switch.

The positive feedback circuit may include a first gain block and a second gain block, wherein the first gain block and the second gain block are operatively coupled between the first current transformer and the second current transformer.

The positive feedback circuit may include a noise suppression network, and the noise suppression network may include a first capacitor, a second capacitor, a first resistor, and a second resistor operatively coupled together.

The second resistor may be configured to adjust a range of the ground neutral fault detected.

The fault detection circuit may be operatively coupled to a ground fault interrupter (GFI) circuit.

The fault detection circuit may be operatively coupled to a three-phase motor.

Implementations of fault detection circuits may include a first current transformer coupled to a second current transformer, a positive feedback circuit including the first current transformer, the second current transformer, a first gain block, a second gain block, a first switch, a second switch, a third switch, and a noise suppression network, all operatively coupled together. The fault detection circuit may also include a plurality of logic gates which may be coupled with the positive feedback circuit. The positive feedback circuit may be configured to oscillate upon detecting a ground neutral fault and to send a fault signal to the plurality of logic gates. The plurality of logic gates may be configured to analyze the fault signal and open the first switch and the second switch and close the third switch. The plurality of logic gates may be configured to identify whether the fault signal represents one of a true fault and a noise fault by analyzing the output of the positive feedback circuit after the first switch and the second switch have been opened.

Implementations of fault detection circuits may include one, all, or any of the following:

The plurality of logic gates may be configured to trip a ground fault interrupter (GFI) circuit if the fault signal represents a true fault.

The circuit may be configured to simultaneously detect a ground neutral fault and a normal ground fault.

The first gain block and the second gain block may be coupled between the first current transformer and the first switch, second switch, and third switch.

Implementations of a method for detecting a fault may include providing a first current transformer and a second current transformer, the first current transformer and the second current transformer electrically coupled with a hot line and a neutral line. The method may also include detecting a potential fault condition using the second transformer and producing an oscillating signal and transmitting the oscillating signal to a plurality of logic gates electrically coupled with the first current transformer and the second current transformer. The method may also include opening a switch electrically coupled with the second current transformer in response to a switching signal from the plurality of logic gates, closing a second switch in response to a second switching signal from the plurality of logic gates, and determining whether the potential fault condition is a true fault condition by monitoring whether the oscillating signal continues after opening the switch.

Implementations of methods for detecting faults may include one, all, or any of the following:

The method may include sending a signal to trip a ground fault interrupter (GFI) circuit if the oscillating signal dissipates after opening the switch.

The method may include closing the switch electrically coupled with the second current transformer to reset the circuit if the oscillation of the first current transformer with the second current transformer continues after opening the switch.

The method may include providing a second oscillating signal and third oscillating signal and determining whether the potential fault condition is a true fault condition after the second oscillating signal and the third oscillating signal are transmitted to the plurality of logic gates.

The method may include sending a signal to trip a three-phase motor if the oscillating signal dissipates after opening the switch.

The oscillating signal may be transmitted through a positive feedback circuit and the positive feedback circuit may include the first current transformer, the second current transformer, a first gain block, a second gain block, the switch, a second switch, a third switch, and a noise suppression network, all operatively coupled together.

The method may include opening the second switch with the first switch in response to a switching signal from the plurality of logic gates and closing the third switch in response to a second switching signal from the plurality of logic gates.

Detecting the potential fault condition may include detecting a resistance less than 10 ohms between the return line and a ground.

The first switch may be opened no later than 64 microseconds after the oscillating signal is produced.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended fault detection circuits will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such fault detection circuits, and implementing components and methods, consistent with the intended operation and methods.

Figure 1:
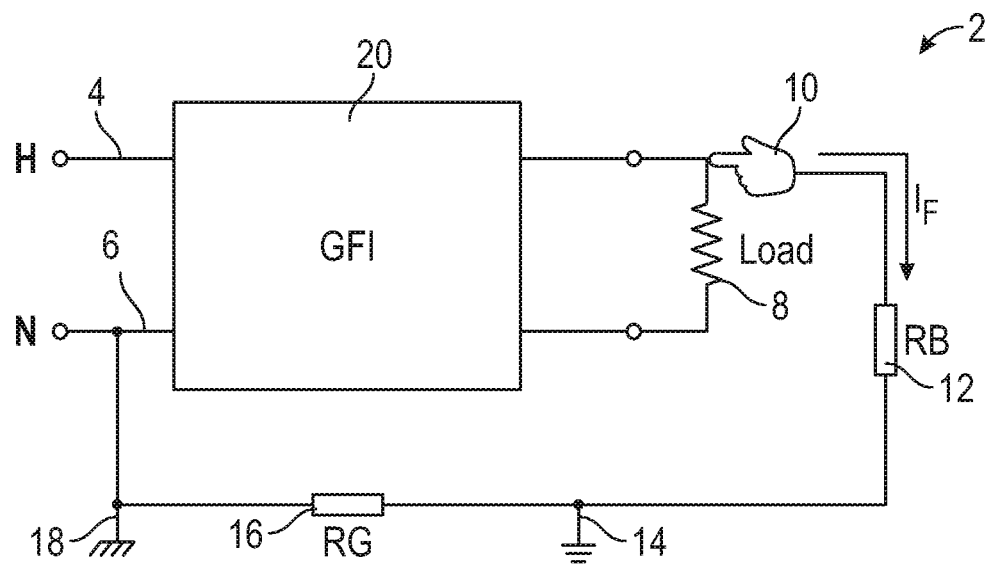
FIG. 1 is an illustration of a ground fault circuit.

Conventionally, electronic appliances receive alternating current (AC) power from a power supply, such as an electrical outlet. The electronic appliance receives the AC power through two conductive lines, a hot line and a neutral (return) line. As a circuit operates, various current faults including ground neutral faults can occur within loads attached to the circuit or through interaction of environmental factors on the circuit. In specific situations, a ground fault may occur which can result in electrical shock to a person. Referring to FIG. 1, a ground fault circuit is illustrated. The circuit 2 includes a hot line 4 and a neutral line 6. Typically, current should flow into the hot line 4, through the load circuit 8, or electrical appliance, and out the neutral line 6. The amount of current flowing through the hot line 4 should be the same as the amount of current flowing through neutral line 6. When a ground fault occurs through a person's body contacting the circuit, causing current to flow through the person into the ground, there is now an imbalance between the amount of current flowing in through the hot line 4 and the amount of current flowing out through the neutral line 6. As illustrated by FIG. 1, an example of a ground fault could include a person 10 or other object making electrical contact with the conductive line 4. In this situation, an increase of current flows through the hot line 4 as current is flowing through the person 10 and through the load circuit 8. The neutral line 6 now has less current as it only has current that has flown through the load circuit 8 and not the current flowing through the person 10 and through the resistance 12 of the body before it reaches the earth ground 14 and through the resistance 16 of the ground before it reconnects with the neutral line 6.

Figure 2:
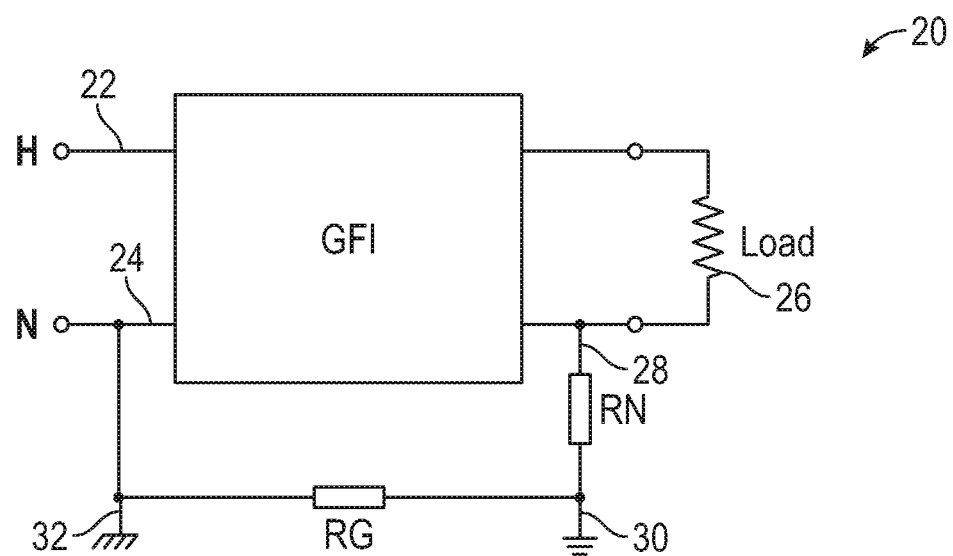
FIG. 2 is an illustration of a ground neutral fault circuit.

Referring to FIG. 2, a ground neutral fault circuit is illustrated. Similar to FIG. 1, the circuit 20 illustrated in FIG. 2 has a hot line 22 and a neutral line 24. Current flows in through the hot line, through the load circuit 26, and out through the neutral line 24. The neutral line is typically connected to ground at the electrical panel 32. When a ground neutral fault occurs, the neutral line 24 is grounded after the load circuit 26. This creates a new parallel conductive path to the neutral line 24. As illustrated by FIG. 2, an example of a normal ground fault could include incorrectly wiring the circuit 20 to include a ground wire 28 at the load circuit 26 extending from the neutral line 24 to the ground 32. While there may be little current flow through the parallel conductive path, the GFI circuit in the circuit 20 is not going to be able to successfully detect a condition where a person or object has contacted the circuit and is connected to ground.

Both normal ground fault conditions and ground neutral fault conditions can lead to electric shock and serious injury. To mitigate the risk of electric shock from normal ground faults or ground neutral faults, circuits have typically utilized ground fault interrupter (GFI) devices as illustrated in FIGS. 1-2. A GFI is used to detect a current fault and trip (open) the circuit coupled to the load, preventing an unintended flow of current from resulting in electric shock. As used herein, GFI is a broad term for a fault detection and circuit interrupter device. Examples of GFI's may include, by non-limiting example, ground fault circuit interrupters (GFCI), appliance leakage circuit interrupters (ALCI), residual current devices (RCD), residual current circuit breakers (RCCB), portable residual current circuits (PRCD), earth leakage current detectors (ELCD), charging circuit interrupting devices (CCID), and equipment end of life (EEOL) devices.

Figure 3:
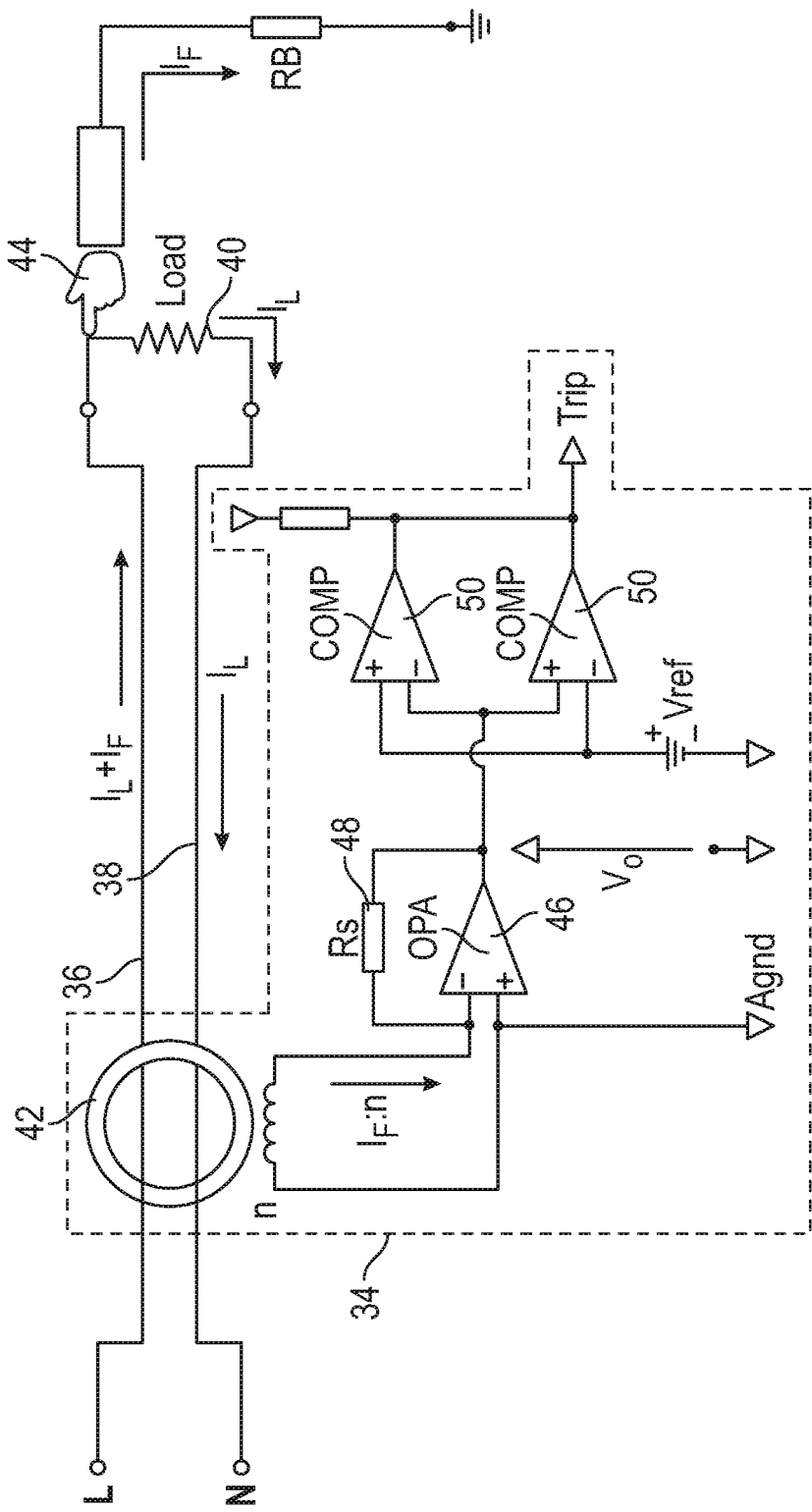
FIG. 3 is an illustration of a conventional ground fault detection circuit.

Referring to FIG. 3, a conventional normal ground fault detection circuit is illustrated. Similar to the circuit of FIG. 1, the GFI 34 is coupled to a circuit including a hot line 36 and a neutral line 38 with a load circuit 40 operatively coupled between the hot line and the neutral line. The GFI includes a first coil 42. For purposes of this application, a coil is referred to as a current transformer. The first coil, or the first current transformer 42, monitors the differential current between current flowing in through hot line 36 and current flowing out through neutral line 38. If there is no difference between the current flowing through hot line 36 and the current flowing through neutral line 38, then the current transformer 32 does not produce an output signal and the circuit coupled to the load 40 will not be tripped. In various implementations, the current flowing out of the neutral line 38 may be less than the current flowing into the hot line 36 as a result of a source 44, such as a person, pulling additional current through hot line 36. In such an implementation, the current transformer 42 may produce a fault signal. The GFI may include an operational amplifier 46 which amplifies the fault signal and a resistor 48. The current fault signal may be converted to a voltage $V_0$ using Ohm's law as shown in equation 1.

$$V_0 = -\frac{I_F}{n} R_S \qquad \text{Eq. 1}$$

$I_F$ is the differential current, or the current flowing through the source 44, $R_S$ is the resistance of resistor 48 and n is the number of windings on the coil, or current transformer. The GFI may also include a plurality of comparators 50. The comparators 50 compare the voltage $V_0$ to a reference voltage $V_{ref}$ and if the voltage $V_0$ exceeds the reference voltage, the circuit may be tripped/opened to prevent any additional current from flowing through the source 44.

Figure 4B:
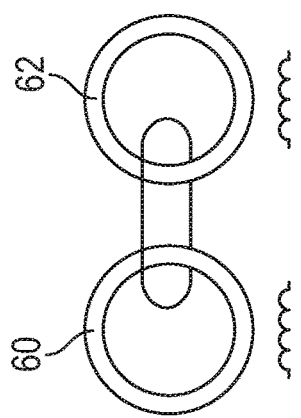
FIGS. 4A-C are an illustrations of a conventional ground neutral fault detection circuit and equivalent circuits thereto.
Figure 4C:
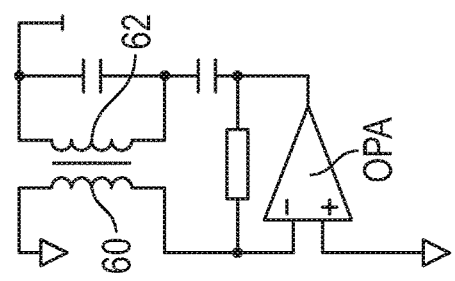
Figure 4A:
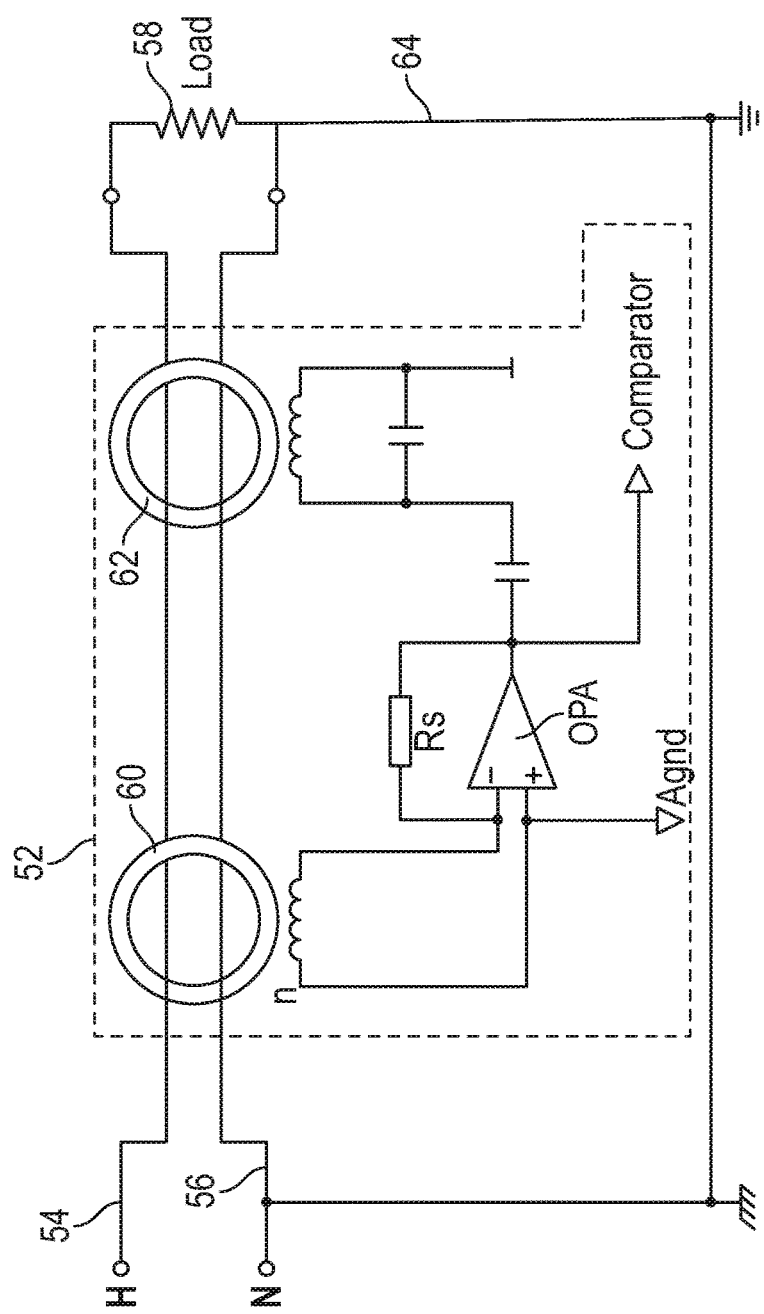

Referring to FIGS. 4A-4C, a conventional ground neutral fault detection circuit is illustrated. Similar to the circuit of FIG. 2, a GFI 52 is coupled to a circuit including a hot line 45 and a neutral line 56 with a load circuit 58 operatively coupled between the hot line and the neutral line. In the implementation illustrated by FIG. 4A, the GFI includes a first current transformer 60 and a second current transformer 62. The GFI uses two current transformers as a GFI with a single transformer, such as the circuit illustrated in FIG. 3, cannot detect a ground neutral fault. When a ground neutral fault condition is not present, the second transformer is configured to induce equal signals into both the hot line 54 and the neutral line 56. Because the signals are the same, the first current transformer will not register a difference between the signals and no fault signal is generated. In contrast to this, when the neutral line 56 is grounded at the load 58 through wire 64 (or other electrical contact), a conductive path is created parallel to the neutral line 56. Referring to FIG. 4B, the result imbalance in the signals induced in the hot line 54 and the neutral line 56 by the second current transformer 62 induces a signal into the first current transformer 60 and an oscillating fault signal is produced in the circuit. When the first current transformer 60 oscillates with the second current transformer 62, the GFI behaves as though it were the equivalent RC oscillator circuit illustrated in FIG. 4C with the first current transformer 60 and the second current transformer 62 together forming a transformer (though lacking an actual physical transformer core). When the fault signal is produced, it may trip the circuit to prevent any further current from flowing through the ground source or wire 64. In various implementations, the fault signal may trip the circuit through a plurality of logic gates which may be positioned next to the GFI circuit. The purpose of detecting the ground neutral situation is to detect the improper wiring/faulty wiring situation which will prevent the GFI circuit from being able to detect the fault condition.

In various implementations, the ground neutral fault detection circuit illustrated in FIGS. 4A-4C may include one or more comparators and is capable of also detecting a ground fault using the first current transformer 60 and the one or more comparators.

Historically, GFI circuits had a test button which could be pressed to manually ensure that the GFI circuit was working properly. Because it was soon realized that few people would ever regularly manually test the GFI circuit, safety regulation companies, such as UL LLC of Northbrook, Ill., instituted requirements that the GFI circuits be self-testing. A self-testing GFI is programmed to trip if there is a differential current in the frequency range of a typical ground neutral fault. While this was not a problem historically, new types of electrical appliances, such as, by non-limiting example, variable speed motors in refrigerators and certain kinds of fluorescent lighting, operate at frequencies which may produce noise signals on the power lines that have frequencies similar to ground neutral faults. As an example, various electrical devices, while operating, may generate between 2 kHz-10 kHz noise signals on the power lines. These frequencies, when received by a GFI, or other fault interrupting circuit, would be perceived as a ground neutral fault. Such noise from electrical devices cannot be filtered out from the ground neutral fault detection circuit as such filters would also filter out the actual faults for which the circuit was intended to monitor.

Figure 5:
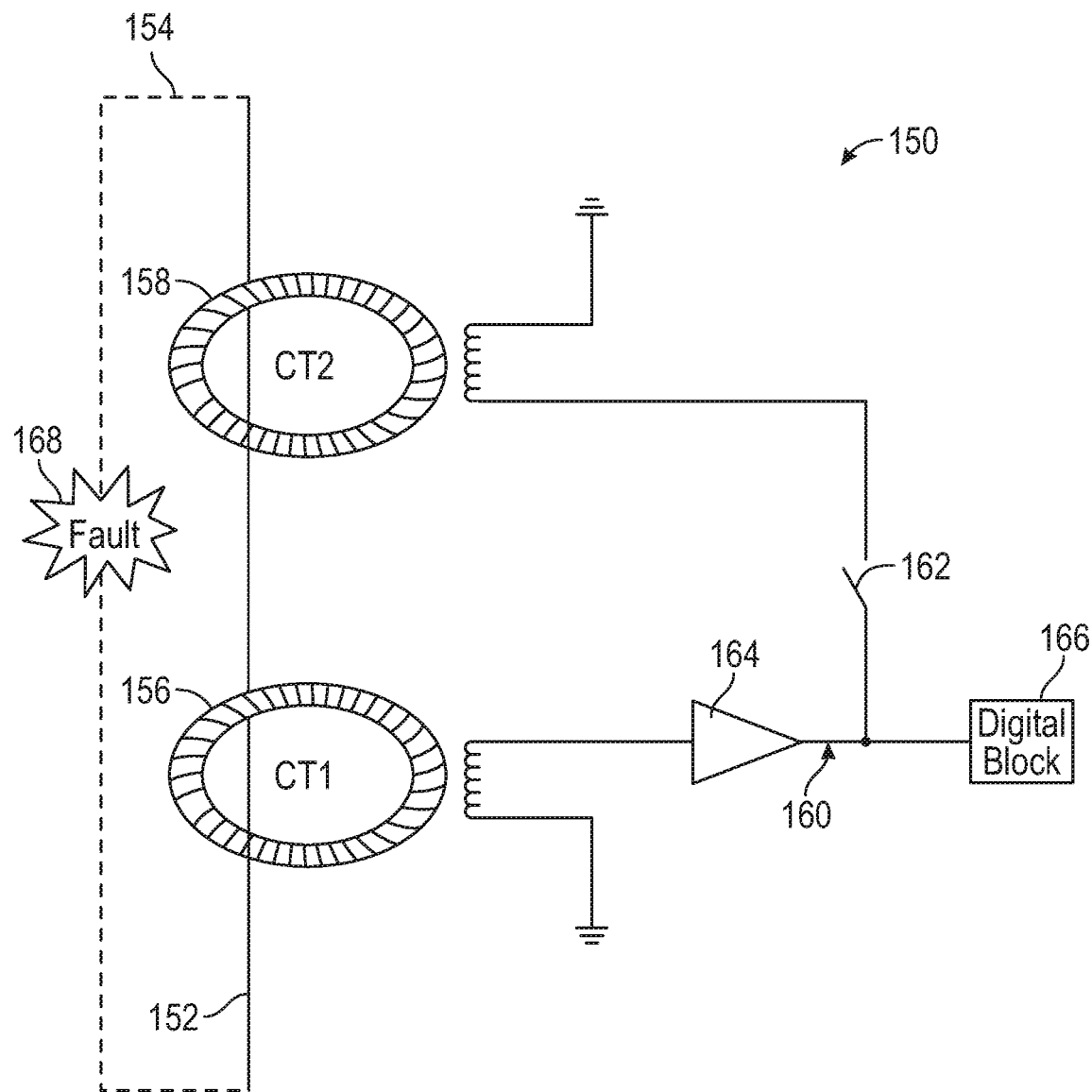
FIG. 5 is an illustration of a first ground neutral fault detection circuit.

Referring to FIG. 5, an implementation of a first ground neutral fault detection circuit is illustrated. The fault detection circuit 150 is operatively coupled to a conductive line 152 through inductive coupling with a first current transformer 156 and a second current transformer 158. The conductive line may be one of a hot line or a neutral line. In various implementations, the fault detection circuit 150 is operatively coupled to both a hot line and a neutral line. The conductive line 152 is coupled to a circuit 154 which may include a fault 168, such as a ground neutral fault, which generally includes a resistance. The fault detection circuit 150 includes a positive feedback circuit 160. In various implementations, the positive feedback circuit 160 may include the first current transformer 156, the second current transformer 158, a switch 162, and at least one of a comparator, an amplifier, an inverter, and any combination thereof, all operatively coupled together. An amplifier, as used herein, may refer to, by non-limiting example, a simple transistor and resistor or an operational amplifier. In various implementations, these components are coupled together and arranged as illustrated in FIG. 5, though many variations and duplications/substitutions of the components may be created using the principles disclosed in this document. In various implementations, the positive feedback circuit may also include a noise suppression network.

In various implementations, the first current transformer 156 is a differential current transformer similar to the first current transformer 60 illustrated in FIG. 4A. In various implementations, the second current transformer 158 is a dormant oscillator which is activated when a potential ground neutral fault is detected. When such a potential fault is detected, the second current transformer 158 induces energy into the first current transformer 156 and an oscillating fault signal is produced through the positive feedback circuit 160. In such an instance, the positive feedback circuit may be referred to as oscillating, even though in actuality the physical positive feedback circuit 160 is not actually physically oscillating but includes oscillating electrical signals therein. In various implementations, the ground neutral fault is only detected when about 10 ohms or less resistance between the neutral line and the ground is detected. In other implementations, the ground neutral fault is only detected when about 5 ohms or less resistance between the neutral line and the ground is detected. In other implementations, a fault may be detected when more than 10 ohms are detected between the neutral line and the ground. Because the resistance used for detection in various implementations is a loop resistance between the neutral line and the ground, the lower the resistance, the more easily the second current transformer couples to the first current transformer and in turn, the more sensitive it is to the existence of a ground neutral fault.

In various implementations, the potential fault signal (referred to herein as "fault signal") may pass through one of one or more amplifiers, one or more comparators, one or more inverters, and any combination thereof. In the implementation illustrated by FIG. 5, the positive feedback circuit includes a single amplifier 164 operatively coupled between the first current transformer 156 and the second current transformer 158 which amplify the oscillating fault signal passing through the positive feedback circuit 160.

In the implementation illustrated by FIG. 5, the positive feedback circuit may include a single switch 162. In other implementations, such as the implementation illustrated by FIG. 6, the positive feedback circuit includes more than one switch. In various implementations, and as illustrated by FIG. 5, the switch 162 may be coupled between the second current transformer 158 and the amplifier 164. In other implementations, the switch 160 may be coupled at any other location on the positive feedback circuit 160.

The fault detection circuit 150 includes a plurality of logic gates 166 coupled to the positive feedback circuit 160. As used herein, a plurality of logic gates may refer to any one of a microprocessor, a microcontroller, a state machine, a plurality of logic elements, or any combination thereof. Unlike many conventional fault detection circuits, the plurality of logic gates 166 of the fault detection circuit 150 is included within the circuit 150 rather than being a separate plurality of logic gates only coupled to the fault detection circuit. In this manner, the overall fault detecting system is smaller than in conventional systems. The plurality of logic gates 166 is configured to analyze the fault signal. In various implementations, the plurality of logic gates 166 may initially detect or analyze the fault signal as the signal oscillates through the positive feedback circuit 160.

In various implementations, the plurality of logic gates 166 is configured to break/open the positive feedback circuit 160 in the event that the plurality of logic gates 166 determines that the fault signal is a potential ground neutral fault. In various implementations, the plurality of logic gates may sufficiently trip the positive feedback circuit through, by non-limiting example, sending a signal that opens a switch or sending a signal to power down an amplifier. In the implementation illustrated by FIG. 5, the plurality of logic gates 166 is configured to break the positive feedback circuit by opening the switch 162. The plurality of logic gates 166 are further configured to identify whether a detected fault signal represents a true fault or a noise fault by analyzing the output of the positive feedback circuit when the positive feedback circuit 160 has been opened, whether that be through opening a switch or some other means of opening (or breaking) the positive feedback circuit. In various implementations, after breaking the positive feedback circuit 160, if the fault signal persists then the plurality of logic gates identifies the fault signal as a noise fault signal and not a true fault signal. However, if the fault signal dissipates when the positive feedback circuit 160 is broken, then the plurality of logic gates identifies the fault signal as a true fault.

The plurality of logic gates 166 may be designed to send a signal to trip the circuit with the electrical device in the event that the plurality of logic gates analyzes the fault signal to be a true fault. In various implementations, the fault detection circuit 150 may be operatively coupled to a GFI circuit and the plurality of logic gates may be configured to trip the GFI circuit if the fault signal represents a true fault. In other implementations, the fault detection circuit may be coupled to a three-phase motor or another type of circuit and may be configured to trip the respective circuit.

While the fault detection circuit 150 has been described herein as a ground neutral fault detection circuit, in various implementations the fault detection circuit 150 may also be a ground fault detection circuit. In such implementations, the first current transformer 156 may alone detect a differential current between the two conductive lines. The differential current, and in turn, the normal ground fault, may be detected in the same or a similar manner to how the ground fault is detected as described in relation to FIG. 3. In various implementations, the fault detection circuit 150 may be capable of simultaneously detecting a normal ground fault and a ground neutral fault.

Figure 6:
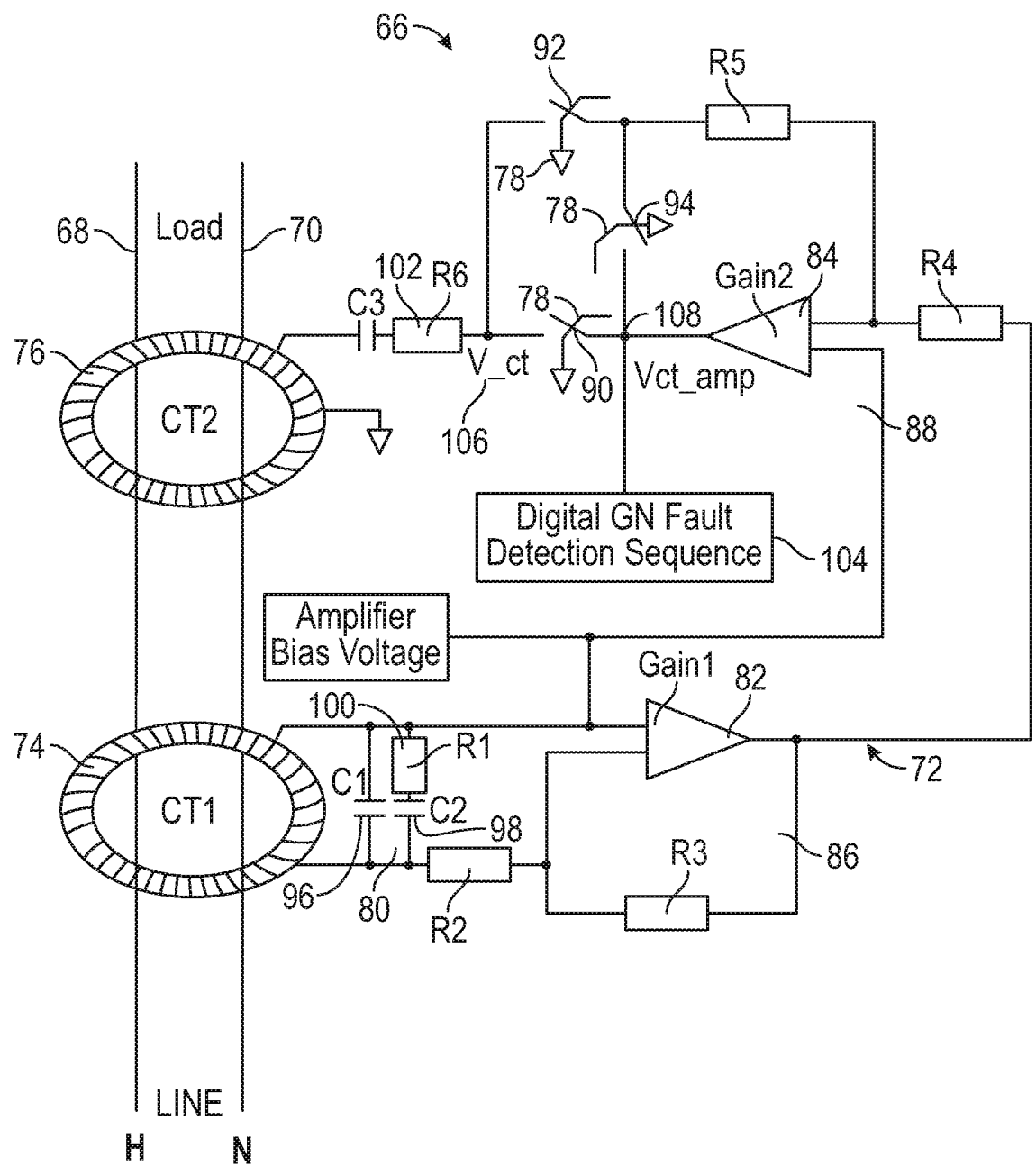
FIG. 6 is an illustration of a second ground neutral fault detection circuit.

Referring to FIG. 6, an implementation of a second ground neutral fault detection circuit is illustrated. The implementation illustrated in FIG. 6 shares many common elements as the implementation illustrated in FIG. 5. The fault detection circuit 66 is operatively coupled to a hot line 68 and a neutral line 70 through inductive coupling with a first current transformer 74 and a second current transform 76. The fault detection circuit 66 includes a positive feedback circuit 72. In various implementations, the positive feedback circuit 72 may include the first current transformer 74, the second current transformer 76, a plurality of switches 78, and at least one of a comparator, an amplifier, and an inverter, all operatively coupled together. In various implementations, these components are coupled together and arranged as illustrated in FIG. 6, though many variations and duplications/substitutions of the components may be created using the principles disclosed in this document. In various implementations, the positive feedback circuit may also include a noise suppression network 80.

In various implementations, the first current transformer 74 is a differential current transformer similar to the first current transformer 60 illustrated in FIG. 4A. In various implementations, the second current transformer 76 is a dormant oscillator which is activated when a potential ground neutral fault is detected. When such a potential fault is detected, the second current transformer 76 induces energy into the first current transformer 74 and an oscillating fault signal is produced through the positive feedback circuit 72. In such an instance, the positive feedback circuit may be referred to as oscillating, even though in actuality the physical positive feedback circuit 72 is not actually physically oscillating but includes oscillating electrical signals therein. In various implementations, the potential ground neutral fault is only detected when about 10 ohms or less resistance between the neutral line and the ground is detected. In other implementations, the potential ground neutral fault is only detected when about 5 ohms or less resistance between the neutral line and the ground is detected. In other implementations, a fault may be detected when more than 10 ohms are detected between the neutral line and the ground. Because the resistance used for detection in various implementations is a loop resistance between the neutral line and the ground, the lower the resistance, the more easily the second current transformer couples to the first current transformer and in turn, the more sensitive it is to the existence of a ground neutral fault.

In various implementations, the potential fault signal (referred to herein as "fault signal") may pass through one of one or more amplifiers, one or more comparators, one or more inverters, and any combination thereof. In the implementation illustrated by FIG. 6, the positive feedback circuit includes at least two amplifiers, a first gain block 82 and a second gain block 84 operatively coupled between the first current transformer 74 and the second current transformer 76 which amplify the oscillating fault signal passing through the positive feedback circuit 72. As illustrated by FIG. 6, the first gain block 82 and the second gain block 84 may be coupled between the first current transformer 74 and the plurality of switches 78, while in other implementations the first gain block and the second gain block may not both be coupled between the first current transformer and the plurality of switches. In various implementations, the positive feedback circuit may have only a single amplifier, no amplifier, or more than two amplifiers configured to amplify the fault signal.

In various implementations, the ground neutral fault detection circuit may include one or more inverters or one or more inverting stages. In the implementation illustrated by FIG. 6, the ground neutral fault detection circuit includes a first inverting stage 86 and a second inverting stage 88.

In other implementations, the positive feedback circuit may include comparators with or without any amplifiers. In such implementations, the comparators may be used in conjunction with the remainder of the circuit to detect ground neutral faults.

In still other implementations, the positive feedback circuit may include inverters without any amplifiers. In such implementations the inverters may be used in conjunction with the remainder of the circuit to detect ground neutral faults.

The positive feedback circuit 72 may include at least two switches 78. In some implementations, the positive feedback circuit only includes two switches. In the implementation illustrated by FIG. 6, the positive feedback circuit includes a first switch 90, a second switch 92, and a third switch 94. In other implementations, the positive feedback circuit 72 may include more than three switches. In various implementations, and as illustrated by FIG. 6, the plurality of switches 78 may be coupled between the second current transformer 76 and the second gain block 84. In other implementations, the plurality of switches 78 may be coupled between the first gain block 82 and the second gain block 84, or at any other location on the positive feedback circuit 72.

In various implementations, the positive feedback circuit may include a noise suppression network 80. The noise suppression network may be various combinations of a plurality of resistors and capacitors (like the particular combination illustrated in FIG. 6). In the implementation illustrated by FIG. 6, the noise suppression network includes a first capacitor 96, a second capacitor 98, a first resistor 100, and a second resistor 102 coupled together. The noise suppression network 80 is configured to filter outside noise that is not in the desired frequency of ground neutral faults that the fault detection circuit 66 is detecting. In various implementations, the second resistor 102 may be tuned to vary the range of frequencies of the ground neutral faults that are to be detected. In various implementations, the noise suppression network 80 may include more or fewer resistors than what is illustrated in FIG. 6 and may include more or less comparators than what is illustrated in FIG. 6. Further, in various implementations, the positive feedback circuit 72 may include a low pass filter. The low pass filter may be coupled between the first gain block 82 and the second gain block 84 in implementations including a first gain block and a second gain block in the positive feedback circuit.

The fault detection circuit 66 includes a plurality of logic gates 104 coupled to the positive feedback circuit 72. Unlike many conventional fault detection circuits, the plurality of logic gates 104 of the fault detection circuit 66 is included within the circuit 66 rather than being a separate plurality of logic gates only coupled to the fault detection circuit. In this manner, the overall fault detecting system is smaller than in conventional systems. In various implementations, the plurality of logic gates 104 may initially detect or analyze the fault signal as the signal oscillates at a voltage current transformer (Vct) node 106 and a voltage current transformer amplifier (Vct_amp) 108. The plurality of logic gates 104 detects the oscillating fault signal's frequency by counting a number of referenced clocks in an oscillation period at node Vct 106 and/or Vct_amp 108, and if the frequency is in a given range it flags it as a potential ground neutral fault.

In various implementations, the plurality of logic gates 104 is configured to break/open the positive feedback circuit 72 in the event that the plurality of logic gates 104 determines that the fault signal is a potential ground neutral fault. In various implementations, the plurality of logic gates may sufficiently trip the positive feedback circuit through, by non-limiting example, sending a signal that opens at least one switch or sending a signal to power down an amplifier. In the implementation illustrated by FIG. 6, the plurality of logic gates 104 is configured to break the positive feedback circuit by opening the first switch 90 and the second switch 92. The plurality of logic gates may also close the third switch 94. The plurality of logic gates are further configured to identify whether a detected fault signal represents a true fault or a noise fault by analyzing the output of the positive feedback circuit when the positive feedback circuit 72 has been opened, whether that be through opening a switch or some other means of opening (or breaking) the positive feedback circuit. In various implementations, after breaking the positive feedback circuit 72, if the fault signal persists then the plurality of logic gates identifies the fault signal as a noise fault signal and not a true fault signal. However, if the fault signal dissipates when the positive feedback circuit 72 is broken, then the plurality of logic gates identifies the fault signal as a true fault.

The plurality of logic gates 104 may be configured to send a signal to trip the circuit with the electrical device in the event that the plurality of logic gates analyzes the fault signal to be a true fault. In various implementations, the fault detection circuit 66 may be operatively coupled to a GFI circuit and the plurality of logic gates may be configured to trip the GFI circuit if the fault signal represents a true fault. In other implementations, the fault detection circuit may be coupled to a three-phase motor or another type of circuit and may be configured to trip the respective circuit.

While the fault detection circuit 66 has been described herein as a ground neutral fault detection circuit, in various implementations the fault detection circuit 66 may also be a ground fault detection circuit. In such implementations, the first current transformer 74 may alone detect a differential current between the hot line 68 and the neutral line 70. The differential current, and in turn, the normal ground fault, may be detected in the same or a similar manner to how the ground fault is detected as described in relation to FIG. 3. In various implementations, the fault detection circuit 66 may be capable of simultaneously detecting a normal ground fault and a ground neutral fault.

Figure 7:
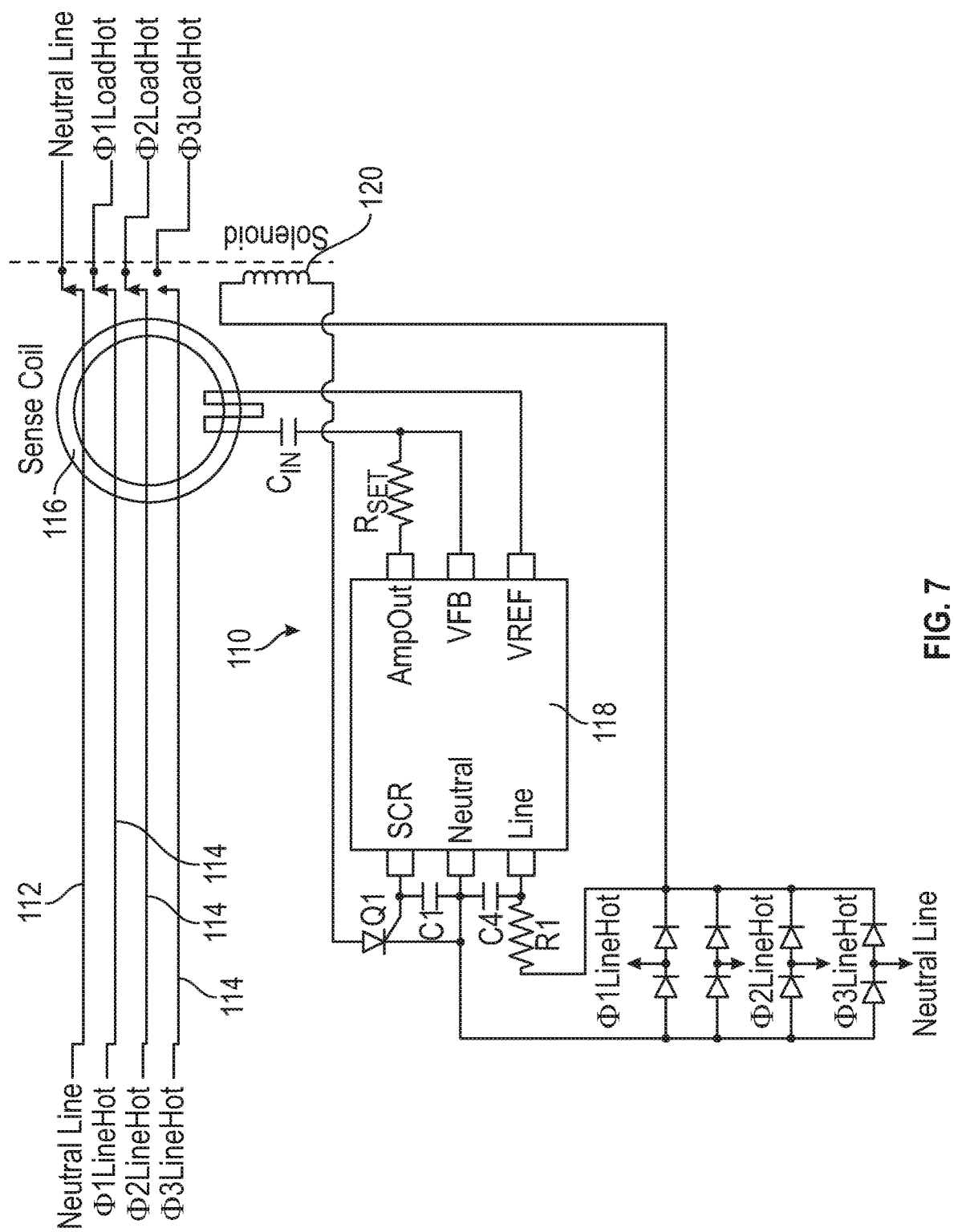
FIG. 7 is an illustration of a fault detection circuit.

Referring to FIG. 7, a fault detection circuit for a three phase electrical system is illustrated. The fault detection circuit 110 is coupled to a neutral line 112 and a plurality of hot lines 114. In various implementations, the fault detection circuit 112 may be coupled to three hot lines. In such implementations, the three hot lines may be coupled to a three phase motor, for example. The fault detection circuit 110 includes a first current transformer 116, or sense coil.

The first current transformer 116 may be configured to monitor the current flowing between the neutral line 112 and each hot line of the plurality of hot lines 114. When a current differential is sensed between the neutral line and any one of the hot lines, the plurality of logic gates 118 may send a signal to a solenoid 120 to trip the circuit and eliminate a normal ground fault. In this way, the first current transformer 116 operates similarly to the first current transformer implementations disclosed herein.

In various implementations, the fault detection circuit 110 may also be configured to detect grounded neutral faults. In such implementations, the fault detection circuit 110 includes a second current transformer (not illustrated, but placed around the neutral line and three hot lines similar to the first current transformer 116). As described for the implementation illustrated in FIG. 6, a positive feedback circuit can be formed between the second current transformer and the first current transformer 116 during operation when a ground neutral fault is detected on the neutral line. The plurality of logic gates 118 is coupled to the positive feedback circuit. In the event of a ground neutral fault, the second current transformer is designed to induce energy into the first current transformer and produce a fault signal as previously described. As the fault signal is produced, the positive feedback circuit then begin to oscillate. Based on the frequency of the oscillation, the fault detection circuit may determine that a normal grounded fault had occurred and the fault detection circuit 110 may send a signal to trip a circuit to cut power to the load circuit. In various implementations, a plurality of switches and the plurality of logic gates may be used to differentiate between a noise signal and a true fault signal as previously disclosed herein. A plurality of logic gates may also be utilized in various implementations.

Figure 8A:
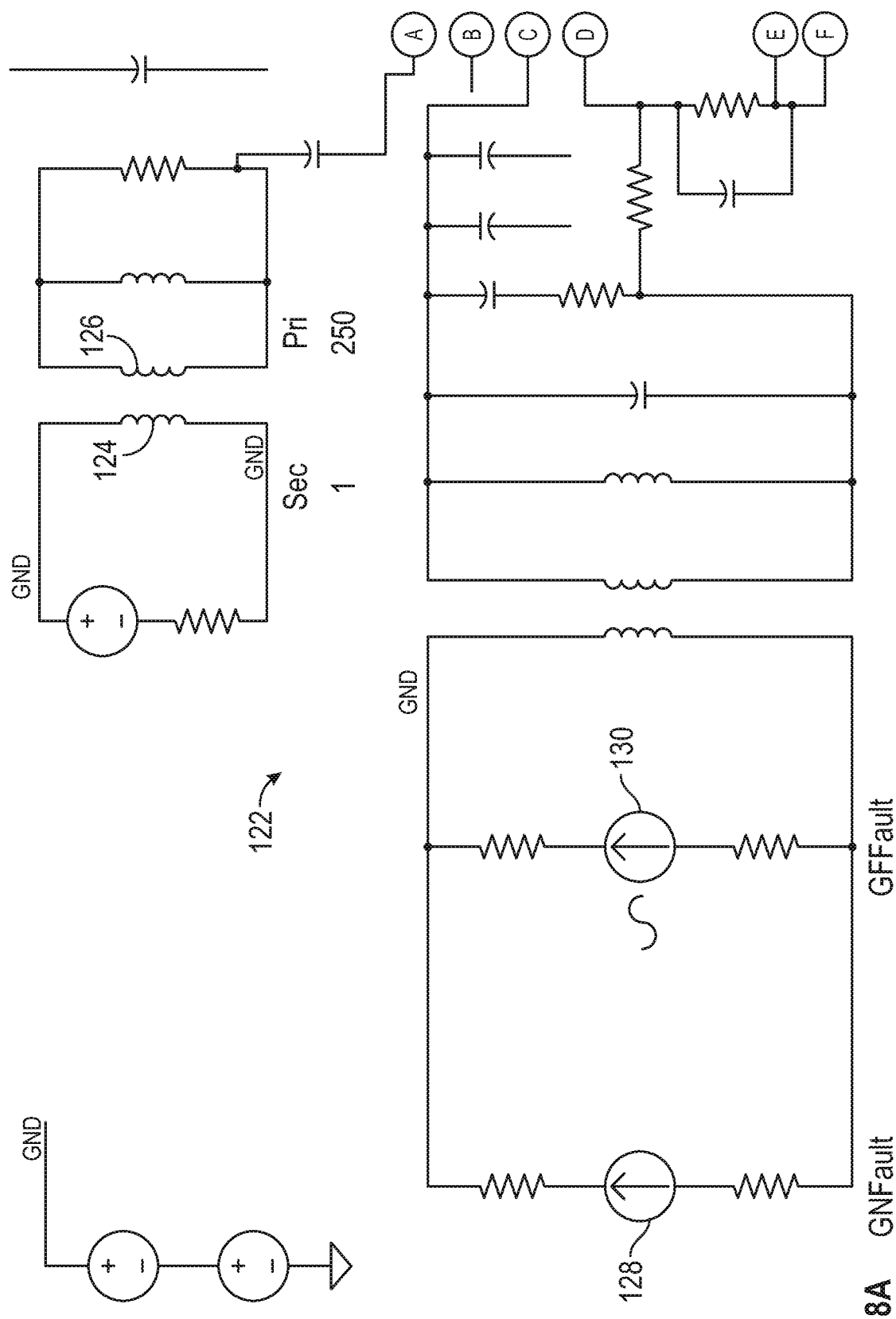
FIG. 8A is an illustration of a first portion of a ground neutral fault detection test circuit.
Figure 8B:
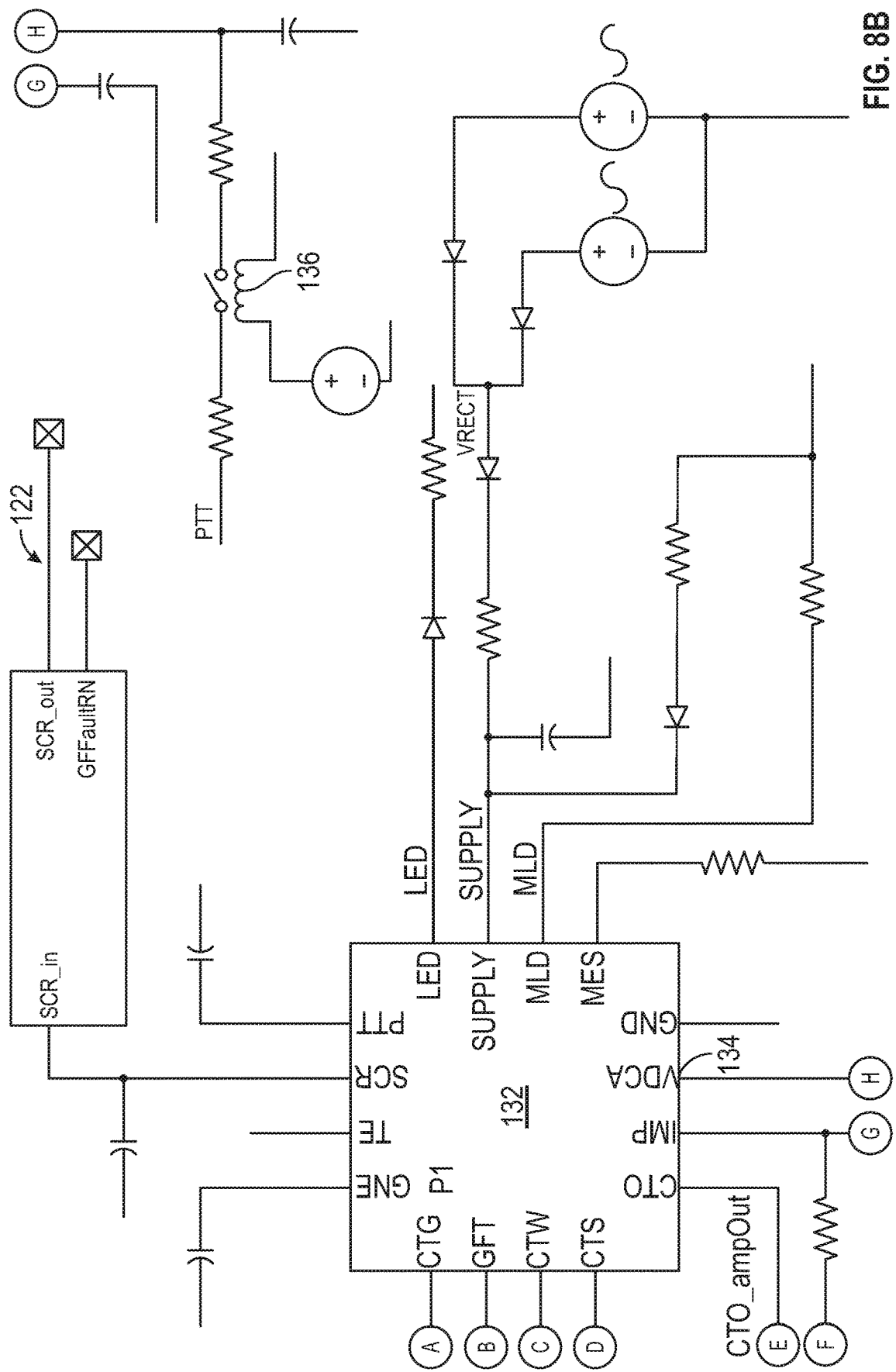
FIG. 8B is an illustration of a second portion of a ground neutral fault detection test circuit.

Referring to FIGS. 8A-8B, a ground neutral fault detection test circuit is illustrated. In order to easily understand the circuit, the ground neutral fault detection test circuit was divided into two separate figures with FIG. 8A and FIG. 8B sharing common nodes A, B, C, and D. The grounded neutral fault detection test circuit 122 includes a first current transformer 124 and a second current transformer 126. The grounded neutral fault detection test circuit 122 also includes a ground neutral fault simulator GNFault 128 and a ground fault GFFault simulator 130. In various implementations, the first current transformer 124, the second current transformer 126, the GNFault simulator, and the GFFault simulator are all coupled to a plurality of logic gates 132. When the plurality of logic gates 132 detects a fault and determines that it is a true fault and not a noise fault, it sends a signal through the VDCA port 134, or the output of the internal linear regulator, to the solenoid 136 which is configured to open a switch to trip the circuit to the load device. As illustrated, a power supply is used to feed power to the plurality of logic gates and the simulators.

Figure 9:
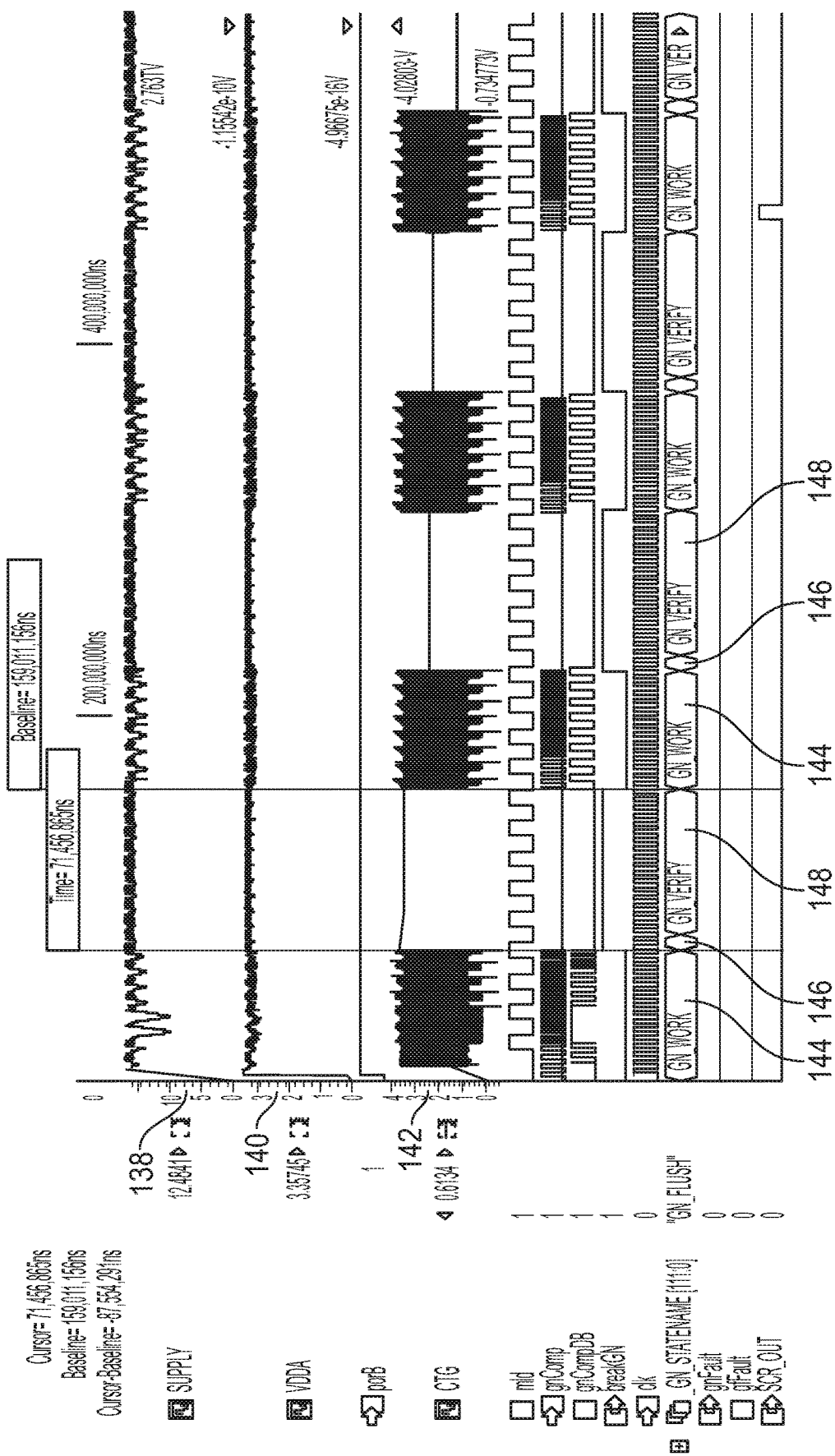
FIG. 9 is a chart illustrating experimental results using the test circuit of FIGS. 8A-8B.

Referring to FIG. 9, a chart illustrating the experimental results from the test circuit of FIGS. 7A-7B is illustrated. As illustrated by FIG. 9, three different frequencies are illustrated, a supply frequency 138, a VDDA frequency 140, or the frequency of the internal regulator output, and a CTG frequency 142, or a frequency of the output that drives the ground neutral CT. The ground neutral fault simulator simulates a ground neutral fault for a length of time indicated by GN_WORK 144. After a predetermined amount of time, the GNFault simulator is activated, and the amount of time the test circuit takes to trip the circuit measured in microseconds is observed. This amount of time is indicated by the gap 146 between GN-WORK 144 and GN_VERIFY 148. As illustrated in FIG. 9, the process was repeated four times.

In various implementations, a method for detecting an electrical fault includes providing a first current transformer and a second current transformer. The fault to be detected may be a ground neutral fault and/or a normal ground fault in various implementations. The first current transformer may be the same as or similar to any first current transformer disclosed herein. Likewise, the second current transformer may be the same as or similar the any second current transformer disclosed herein. The method also includes coupling the first current transformer and the second current transformer to a hot line and a neutral line that are coupled to a load circuit and configured to receive and transmit a flow of current.

Figure 10:
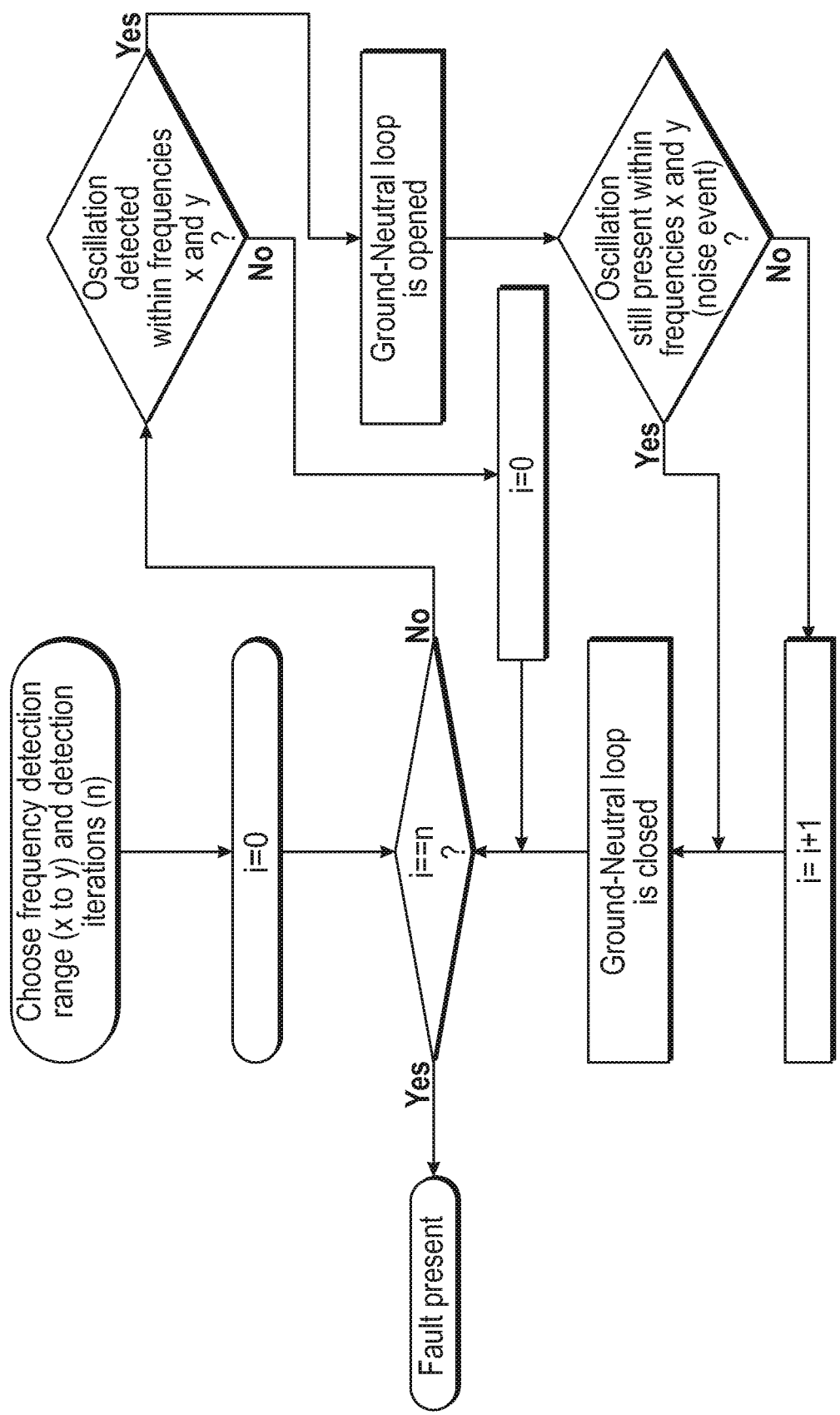
FIG. 10 is a flow chart of an implementation of a method of detecting a fault using a ground neutral fault detection circuit implementation.

In various implementations, the method for detecting an electrical fault includes detecting a potential fault condition using the second transformer and producing an oscillating signal and transmitting the oscillating signal to a plurality of logic gates electrically coupled with the first current transformer and the second current transformer. Referring to FIG. 10, a flow chart illustrating an implementation of a method carried out by the plurality of logic gates to detect a ground neutral fault is shown. The method, as illustrated in FIG. 10, may also include predetermining the frequency detection range, or the frequency range of any faults to be detected. This may be done by adjusting the second current transformer to only produce oscillations within the system upon detecting a given range of frequencies (X to Y). The plurality of logic gates may be programmed to recognize signals from the second current transformer that correspond with the range of frequencies. In various implementations, the potential fault condition will be detected when a resistance less than ten ohms is detected between the return line and a ground. The method may also include determining the detection iteration limit (n) required before the ground neutral fault detection circuit determines there is a true fault present. When the number of detection iterations (i) equals the detection iteration limit, (n), then a true fault is determined to be present by the plurality of logic gates.

In various implementations, the method for detecting a fault includes generating an oscillating signal within a positive feedback circuit. Generating or producing the oscillating signal within the positive feedback circuit is also referred to herein as transmitting a fault signal through the positive feedback circuit. If there is no oscillating signal present, or if the oscillation is outside of the predetermined range, then i=0 and no true fault condition will be found. In various implementations, the positive feedback circuit may include, by non-limiting example, a first current transformer, a second current transformer, a first gain block, a second gain block, at least one switch, a second switch and a noise suppression network, and any combination thereof, operatively coupled together. The positive feedback circuit may be the same as or similar to any positive feedback loop previously disclosed herein.

In various implementations, the method for detecting a fault includes transmitting the fault signal through the positive feedback circuit to a plurality of logic gates which are electrically coupled to the first current transformer and the second current transformer. If the plurality of logic gates detects the oscillation within the predetermined range (between X and Y), then i≠0. In such an event, the plurality of logic gates ensures that positive feedback circuit is unbroken for a predetermined amount of time. The plurality of logic gates may ensure this by closing a switch or powering an amplifier. In various implementations, the circuit is unbroken for no more than about 64 microseconds and no less than about 9 microseconds. In other implementations, the circuit may remain unbroken for more than about 64 microseconds and less than about 9 microseconds.

After the predetermined amount of time has passed, the method may include breaking the positive feedback circuit. The positive feedback circuit may be broken through powering down an amplifier or by opening (by sending a signal from the plurality of logic gates) the at least one switch electrically coupled with the second current transformer in response to a switching signal from the plurality of logic gates, and in implementations with a plurality of switches, such as the implementation illustrated by FIG. 6, closing a second or a third switch in response to a second switching signal from the plurality of logic gates. In this manner, the positive feedback circuit is opened, or broken. An implementation of a method for detecting a fault includes determining whether the potential fault condition is a true fault condition by monitoring whether the oscillating signal continues after closing of the second switch. If the oscillation does continue, then it is determined that the oscillating signal was the result of a noise event and that the fault signal was a noise signal and not a true fault signal. The implementation of the method may include completing the positive feedback circuit by powering up the amplifier or closing the switch (and in implementations with a plurality of switches, opening the second or third switch) in a noise event to reset the circuit and to resume monitoring for fault conditions.

On the other hand, if the oscillating signal dissipates, then it is determined that the oscillating signal was the result of a true ground neutral fault and that the fault signal was a true fault signal. In such an event, the detection iteration (i) is incremented by 1. Thus, if the detection iteration limit (n) is set to 1, then i=n and a true fault signal would be detected. In implementations where (i)>1, the method may include closing the positive feedback circuit and repeating the above process for any number of iterations until i=n. Specifically, the method may include providing a second oscillating signal in the same manner the first oscillating signal was produced and determining whether the potential fault condition is a true fault condition after the second oscillating signal is transmitted to the plurality of logic gates by determining if the oscillating signal dissipates upon breaking the positive feedback circuit. If the oscillating signal does not dissipate, then it is determined that the first oscillating signal and the second oscillating signal were noise signals. However, if the oscillating signals dissipate after breaking the positive feedback circuit, then (i) is incremented by one (in this case, i=2). If i=n, then it is determined that a true fault signal is present. However, in implementations where (i) remains less than (n), the method may include closing the positive feedback circuit and detecting a third oscillating signal in the same manner the first and second oscillating signals were produced and determining whether the potential fault condition is a true fault condition after the second oscillating signal is transmitted to the plurality of logic gates by determining if the oscillation dissipates upon opening the switch for the third time (and in implementations with a plurality of switches, closing the second or third switch for the third time). If the oscillating signal does not dissipate, then it is determined that the third oscillating signal was a noise signal. However, if the oscillating signals dissipate after breaking the positive feedback circuit, then (i) is incremented by one. If i=n, then it is determined that a true fault signal is present. The above process may be repeated until i=n. In various implementations, n=3, meaning that the plurality of logic gates and the fault detection circuit repeats the detection process three times in order to ensure that the fault signal is actually a true fault signal. In various implementations, (n) may be greater than 3 to increase the robustness of the system or (n) may be less than 3 to increase the responsiveness of the system. In various implementations, the detection iteration limit may be increased if the initial amount of time the positive feedback circuit is closed is relatively low. In other implementations, the detection iteration limit may be decreased if the initial amount of time the positive feedback circuit is closed is relatively high.

In various implementations, and as illustrated in FIG. 6, a first switch and second switch may be opened and closed to break the positive feedback circuit. In other implementations, the method may not include a plurality of switches to break the circuit but may include powering down an amplifier, or using another method to otherwise break/open the circuit of the positive feedback circuit.

In various implementations, after a true fault condition is detected, the method may include sending a signal to trip a GFI circuit if the oscillating signal dissipates after breaking the positive feedback circuit, or opening the switch. In various implementations, this signal is only sent if i=n. In other implementations, the method may include sending a signal to trip a three-phase motor or other device if the oscillating signal dissipates after closing of the second switch. In various implementations, this signal is only sent if i=n.

In places where the description above refers to particular implementations of fault detection circuits and implementing components, sub-components, methods and sub-methods, it should be readily apparent that a number of modifications may be made without departing from the spirit thereof and that these implementations, implementing components, sub-components, methods and sub-methods may be applied to other fault detection circuits.

What is claimed is:

1. A fault detection circuit comprising:
   a first current transformer coupled to a second current transformer;
   a positive feedback circuit comprising the first current transformer, the second current transformer, a first switch, and one of a comparator, an amplifier, an inverter, and any combination thereof, all operatively coupled together; and
   a plurality of logic gates coupled with the positive feedback circuit;
   wherein the positive feedback circuit is configured to oscillate upon detecting a ground neutral fault and to send a fault signal to the plurality of logic gates;
   wherein the plurality of logic gates are configured to analyze the fault signal and open the first switch; and
   wherein the plurality of logic gates are further configured to identify whether the fault signal represents one of a true fault and a noise fault by analyzing the output of the positive feedback circuit after the first switch has been opened.

2. The circuit of claim 1, further comprising a second switch and a third switch, wherein the second switch is configured to open with the first switch.

3. The circuit of claim 1, wherein the positive feedback circuit further comprises a first gain block and a second gain block, wherein the first gain block and the second gain block are operatively coupled between the first current transformer and the second current transformer.

4. The circuit of claim 1, wherein the positive feedback circuit further comprises a noise suppression network, the noise suppression network comprising a first capacitor, a second capacitor, a first resistor, and a second resistor operatively coupled together.

5. The circuit of claim 4, wherein the second resistor is configured to adjust a range of the ground neutral fault detected.

6. The circuit of claim 1, wherein the fault detection circuit is operatively coupled to a ground fault interrupter (GFI) circuit.

7. The circuit of claim 1, wherein the fault detection circuit is operatively coupled to a three-phase motor.

8. A fault detection circuit comprising:
a first current transformer coupled to a second current transformer;
a positive feedback circuit comprising the first current transformer, the second current transformer, a first gain block, a second gain block, a first switch, a second switch, a third switch, and a noise suppression network, all operatively coupled together; and
a plurality of logic gates coupled with the positive feedback circuit;
wherein the positive feedback circuit is configured to oscillate upon detecting a ground neutral fault and to send a fault signal to the plurality of logic gates;
wherein the plurality of logic gates are configured to analyze the fault signal and open the first switch and the second switch and close the third switch; and
wherein the plurality of logic gates are further configured to identify whether the fault signal represents one of a true fault and a noise fault by analyzing the output of the positive feedback circuit after the first switch and the second switch have been opened.

9. The circuit of claim 8, wherein the plurality of logic gates is further configured to trip a ground fault interrupter (GFI) circuit if the fault signal represents a true fault.

10. The circuit of claim 8, wherein the circuit is configured to simultaneously detect a ground neutral fault and a normal ground fault.

11. The circuit of claim 8, wherein the first gain block and the second gain block are coupled between the first current transformer and the first switch, second switch, and third switch.

12. A method for detecting a fault comprising:
providing a first current transformer and a second current transformer, the first current transformer and the second current transformer electrically coupled with a hot line and a neutral line;
detecting a potential fault condition using the second current transformer;
producing an oscillating signal and transmitting the oscillating signal to a plurality of logic gates electrically coupled with the first current transformer and the second current transformer;
opening a switch electrically coupled with the second current transformer in response to a switching signal from the plurality of logic gates; and
determining whether the potential fault condition is a true fault condition by monitoring whether the oscillating signal continues after opening the switch.

13. The method of claim 12, further comprising sending a signal to trip a ground fault interrupter (GFI) circuit if the oscillating signal dissipates after opening the switch.

14. The method of claim 12, further comprising closing the switch electrically coupled with the second current transformer to reset the circuit if the oscillating signal continues after opening the switch.

15. The method of claim 12, further comprising providing a second oscillating signal and third oscillating signal and determining whether the potential fault condition is a true fault condition after the second oscillating signal and the third oscillating signal are transmitted to the plurality of logic gates.

16. The method of claim 12, further comprising sending a signal to trip a three-phase motor if the oscillating signal dissipates after opening the switch.

17. The method of claim 12, wherein the oscillating signal is transmitted through a positive feedback circuit, the positive feedback circuit comprising the first current transformer, the second current transformer, a first gain block, a second gain block, the switch, a second switch, a third switch, and a noise suppression network all operatively coupled together.

18. The method of claim 17, further comprising opening the second switch with the switch in response to a switching signal from the plurality of logic gates and closing the third switch in response to a second switching signal from the plurality of logic gates.

19. The method of claim 12, wherein detecting the potential fault condition comprises detecting a resistance less than 10 ohms between a return line and a ground.

20. The method of claim 12, wherein the switch is opened no later than 64 microseconds after the oscillating signal is produced.

* * * * *